(12) United States Patent
Grossman et al.

(10) Patent No.: US 10,884,656 B2
(45) Date of Patent: Jan. 5, 2021

(54) PERFORMING BACKGROUND FUNCTIONS USING LOGIC INTEGRATED WITH A MEMORY

(71) Applicant: Microsoft Technology Licensing, LLC, Redmond, WA (US)

(72) Inventors: Mark S. Grossman, Palo Alto, CA (US); Xiaoling Xu, Cupertino, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 256 days.

(21) Appl. No.: 15/684,659

(22) Filed: Aug. 23, 2017

(65) Prior Publication Data

US 2018/0364944 A1 Dec. 20, 2018

Related U.S. Application Data

(60) Provisional application No. 62/521,017, filed on Jun. 16, 2017.

(51) Int. Cl.
*G06F 3/06* (2006.01)
*G11C 7/10* (2006.01)
*G11C 11/4076* (2006.01)

(52) U.S. Cl.
CPC .......... *G06F 3/0659* (2013.01); *G06F 3/0604* (2013.01); *G06F 3/0673* (2013.01); *G11C 7/1006* (2013.01); *G11C 11/4076* (2013.01); *G11C 7/1042* (2013.01); *G11C 2207/2245* (2013.01)

(58) Field of Classification Search
CPC ..... G06F 3/0659; G06F 3/0604; G06F 3/0673
See application file for complete search history.

(56) References Cited

U.S. PATENT DOCUMENTS

| 5,598,372 A | 1/1997 | Matsumoto et al. |
| 5,926,839 A | 7/1999 | Katayama |
| 6,489,210 B1 | 12/2002 | Sohn et al. |
| 6,909,635 B2 | 6/2005 | Forbes et al. |

(Continued)

OTHER PUBLICATIONS

"International Search Report & Written Opinion Issued in PCT Application No. PCT/US18/034264", dated Oct. 25, 2018, 11 Pages.

(Continued)

*Primary Examiner* — Nanci N Wong
(74) *Attorney, Agent, or Firm* — Ranjeev Singh; Singh Law, PLLC (57) ABSTRACT

Logic integrated with a memory and related methods for performing background functions are provided. A method in a memory includes, in response to a request from a host separate from the memory, initiating processing of a background function. The method further includes automatically monitoring the memory to detect whether any standard operation requiring a use of at least one of the plurality of the memory cells of the memory or at least one data path of the memory is being performed. The method further includes automatically suspending the processing of the background function when the standard operation requiring the use of a memory cell or a data path of the memory is detected unless the processing of the background function requires only resources that are provided as part of the logic integrated with the memory and that are configured to process only the background function.

20 Claims, 5 Drawing Sheets

(56) References Cited

U.S. PATENT DOCUMENTS

| | | | |
|---|---|---|---|
| 7,023,040 B2 | 4/2006 | Forbes et al. | |
| 8,489,861 B2 | 7/2013 | Dowling | |
| 8,601,202 B1* | 12/2013 | Melcher | G11C 16/349 |
| | | | 711/103 |
| 9,996,291 B1* | 6/2018 | Izhar | G06F 3/0685 |
| 2002/0040420 A1 | 4/2002 | Yamauchi et al. | |
| 2009/0034349 A1* | 2/2009 | Miura | G11C 7/24 |
| | | | 365/189.17 |
| 2012/0173792 A1* | 7/2012 | Lassa | G06F 3/0659 |
| | | | 711/103 |
| 2013/0061249 A1* | 3/2013 | Schwartz, Jr. | G06F 9/44521 |
| | | | 719/318 |
| 2014/0146589 A1 | 5/2014 | Park et al. | |
| 2014/0177375 A1 | 6/2014 | Mcclain | |
| 2014/0245316 A1* | 8/2014 | Archer | G06F 15/17318 |
| | | | 718/104 |
| 2014/0330785 A1* | 11/2014 | Isherwood | G06F 11/1446 |
| | | | 707/640 |
| 2015/0026505 A1* | 1/2015 | Yamamoto | G06F 1/12 |
| | | | 713/400 |
| 2016/0239205 A1* | 8/2016 | Rothberg | G06F 3/064 |
| 2017/0052899 A1* | 2/2017 | Lin | G06F 12/0891 |
| 2017/0294237 A1* | 10/2017 | Li | G11C 29/76 |
| 2017/0344658 A1* | 11/2017 | Luo | G06F 16/958 |
| 2018/0077236 A1* | 3/2018 | Niikura | G06F 3/0635 |

OTHER PUBLICATIONS

Carvalho, Carlos, "The Gap between Processor and Memory Speeds", In Proceedings of 3rd Internal Conference on Computer Architecture, Jan. 28, 2002, pp. 27-34.

Yamauchi, et al., "A Single Chip Multiprocessor Integrated with DRAM", In Proceedings of 24th International Symposium on Computer Architecture, Jun. 1997, 8 pages.

Lee, et al., "Excavating the Hidden Parallelism Inside DRAM Architectures with Buffered Compares", Published in IEEE Transactions on Very Large Scale Integration (VLSI) Systems, vol. 25, Issue 6, Jun. 2017, pp. 1793-1806.

Patterson, et al., "A Case for Intelligent RAM: IRAM", In Publication of IEEE Micro vol. 17, Issue 2, Mar. 1997, 23 Pages.

Wang, et al., "An Overview of Micron's Automata Proces", In Proceedings of International Conference on Hardware/Software Codesign and System Synthesis, Oct. 2, 2016, 3 Pages.

* cited by examiner

PERFORMING BACKGROUND FUNCTIONS USING LOGIC INTEGRATED WITH A MEMORY

CROSS-REFERENCE TO A RELATED APPLICATION

This application claims the benefit of U.S. Provisional Application No. 62/521,017, filed Jun. 16, 2017, titled "PERFORMING BACKGROUND FUNCTIONS USING LOGIC IN A MEMORY," the entire contents of which are hereby incorporated herein by reference.

BACKGROUND

Traditional computing systems include a CPU that may be coupled to a memory, such as a dynamic random access memory (DRAM). The CPU performs read/write operations on the DRAM to access the data stored in the DRAM. As part of these operations, the CPU may issue commands to the DRAM via a DRAM controller. The DRAM may process the commands based on its timing specification and provide the data to the CPU or store the data provided by the CPU.

SUMMARY

In one example, the present disclosure relates to a method in a memory, having a plurality of memory cells, configured to perform standard operations based on at least one specification promulgated by a standards body. The method may include, using logic integrated with the memory, in response to a request from a host separate from the memory, initiating processing of a background function. The method may further include during processing of the background function using the logic integrated with the memory, automatically monitoring the memory to detect whether any standard operation requiring a use of at least one of the plurality of the memory cells of the memory or at least one data path of the memory is being performed. The method may further include automatically suspending the processing of the background function when the standard operation requiring the use of the at least one of the plurality of the memory cells of the memory or the at least one data path of the memory is detected unless the processing of the background function requires only resources that are provided as part of the logic integrated with the memory and that are configured to process only the background function.

In another example, the present disclosure relates to a memory having a plurality of memory cells and logic integrated with the memory, where the memory is configured to perform standard operations based on at least one specification promulgated by a standards body. The logic integrated with the memory may be configured to, in response to a request from a host, separate from the memory, initiate processing of a background function. The logic integrated with the memory may further be configured to during processing of the background function, automatically monitor the memory to detect whether any standard operation requiring a use of at least one of the plurality of the memory cells of the memory or at least one data path of the memory is being performed. The logic integrated with the memory may further be configured to automatically suspend the processing of the background function when the standard operation requiring the use of the at least one of the plurality of the memory cells of the memory or the at least one data path of the memory is detected unless the processing of the background function requires only resources that are provided as part of the logic integrated with the memory and that are configured to process only the background function.

In another example, the present disclosure relates to a memory having a plurality of memory cells and logic integrated with the memory, where the memory is configured to perform standard operations based on at least one specification promulgated by a standards body. The memory may further be configured to operate in a first mode and operate in a second mode. In the first mode, the memory may be configured to: in response to a first request from a host separate from the memory, initiate processing of a first background function, during processing of the first background function using the logic integrated with the memory, automatically monitor the memory to detect whether any standard operation requiring a use of at least one of the plurality of the memory cells of the memory or at least one data path of the memory is being performed, and automatically suspend the processing of the first background function when the standard operation requiring the use of the at least one of the plurality of the memory cells of the memory or the at least one data path of the memory is detected unless the processing of the first background function requires only resources that are provided as part of the logic integrated with the memory and that are configured to process only the first background function. In the second mode, the memory may be configured to: in response to a second request from the host separate from the memory, initiate processing of a second background function, initiate processing of a background function, in response to a third request from the host, suspend the processing of the second background function, and in response to a fourth request from the host, resume the processing of the second background function.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Examples described in this disclosure relate to memory and systems with enhanced logic and control that can be used to perform functions in the background. As an example, background functions can be performed without the issuance of commands promulgated by a standards body (e.g., JEDEC). Certain examples relate to memories, such as dynamic random access memories (DRAMs). DRAMs are typically coupled to a host, such as a CPU, a GPU, or another type of processor for providing non-volatile memory storage for programs and data. In many instances because of the CPU's limitations, several DRAM read cycles may be used to read the data from the DRAM and, after performing computing functions using the CPU, several DRAM write cycles may be used to write the results or any other relevant data back to the DRAM. Such I/O operations are power intensive. At least for this reason, there is a need to better manage the division of responsibility between the CPU and the DRAM. Certain examples in the disclosure relate to performing functions using the logic contained in a memory (e.g., a DRAM). The functions can be performed, in the background, opportunistically such that the normal read/write operations being performed by the DRAM are not affected. As an example, the functions can be performed during gaps between normal operations, such as read/write operations. Advantageously, long running functions can be performed in the background while consuming less power because individual reads and writes over the interface of the DRAM (e.g., I/O operations) need not be performed; and once a long running function is completed, the results may be read back in one extra operation. In this example the result of the long running function, once completed, will be stored in the DRAM itself. In one example, the enhanced logic and control inside the DRAM may keep track of the status of signals that indicate the beginning and the completion of the DRAM operations. Such signals include, but are not limited to, signals such as row address strobe (RAS), column address strobe (CAS), clock enable (CKE), other DRAM internal signals, or other DRAM signals that are received or sent via the external interfaces of the DRAM. In one example, the enhanced logic and control may initiate tasks (e.g., starting a new background function) based on certain new DRAM commands initiated by the host (e.g., a CPU). Such commands may be initiated based on new combinations of the existing DRAM signals (e.g., RAS, CAS, CKE, or WE), and control of such background functions may be based on new bits contained in the mode registers associated with the DRAM. As an example, the enhanced logic and control may access mode registers (e.g., MR0 through MR3) via a standard LOAD MODE command.

Figure 1:
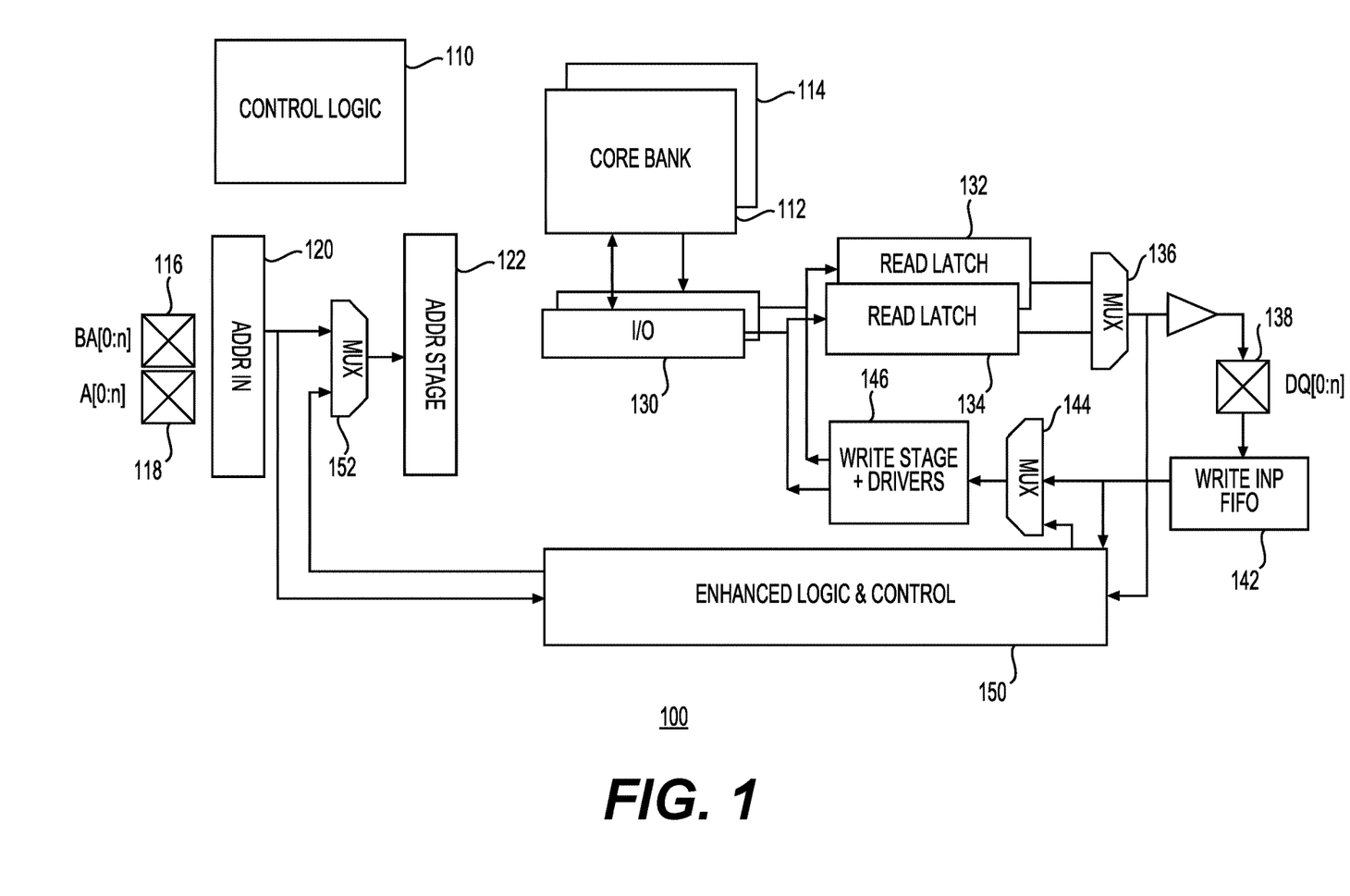
FIG. 1 shows a diagram of a memory with enhanced logic and control in accordance with one example.

FIG. 1 shows a diagram of a memory (with enhanced logic and control) 100 in accordance with one example. In one example, memory 100 may be a dynamic random access memory (DRAM) chip. Memory 100 may include control logic 110, core banks 112 and 114, bank address terminals (BA[0:n]) 116, address terminals (A[0:n]) 118, address latch (e.g., ADDR IN) 120, address stage 122, I/O block 130, read latches 132 and 134, multiplexer 136, write stage and drivers 146, multiplexer 144, input/output pins (DQ[0:n]) 138, and write input FIFO 142. Memory 100 may further include enhanced logic & control 150 coupled to multiplexer 152. Memory 100 may receive address information corresponding to data stored in core banks 112 and/or 114 via bank address terminals (BA[0:n]) 116, address terminals (A[0:n]) 118, and address stage 122. The address information may be used to select a memory location on the chip. The address terminals may be used for both row and column address selection by asserting the row and column addresses in a multiplexed fashion. The number and organization of address terminals and core banks may depend on the memory's size and organization. The voltage-level present at each address terminal at the time that RAS or CAS goes active may determine the row or column address, respectively. The address information may correspond to a read or a write operation. In response to a read operation, memory 100 may provide data via I/O block 130, read latches 132 and 134 and multiplexer 136 to input/output pins (DQ[0:n]) 138. As part of the read operation a certain sequence of steps may occur, including: (1) providing the row address via the address terminals; (2) asserting RAS signal by changing its state from high to low; (3) providing column address via the address terminals after asserting the CAS signal; and (4) after a certain time (prescribed by the memory timing specification) once the data appears on the input/output terminals, changing the RAS signal and the CAS signal to their inactive stage. These steps may be performed within the timing constraints imposed by the memory specification. A write operation may result in data being provided to memory via write input FIFO 142, write stage and drivers 146, and I/O block 130. As part of the write operation a certain sequence of steps may occur, including: (1) providing the row address via the address terminals; (2) asserting RAS signal by changing its state from high to low; (3) providing column address via the address terminals after asserting the CAS signal; and (4) providing the data to the memory via the input/output terminals and changing the RAS signal and the CAS signal to their inactive stage. These steps may be performed within the timing constraints imposed by the memory specification. The data under the control of control logic 110 may be written into a respective bank.

With continued reference to FIG. 1, enhanced logic & control 150 may include at least one arithmetic logic unit (ALU) to perform operations, such as add, count, compare, bitwise AND, shift, and bitwise XOR. Enhanced logic & control 150 may further include registers, including general counters, next-address value register, CRC value registers, and other registers for storing intermediate values. Enhanced logic & control 150 may further include data paths and interfaces to read incoming write data and provide calculated data to the core banks or to the input/output pins of the memory. At least one controller incorporated in enhanced logic & control 150 may include logic to perform the following functions: (1) receive legacy and enhanced external commands, (2) pass through incoming addresses into decode logic associated with the memory, (3) transfer incoming data to the respective core bank for legacy commands, (4) receive data from a core bank, (5) generate read and write operations internally, (6) generate new addresses and provide those to the decode logic, and (7) perform complex operations with multiple internal reads and writes in the background without interfering with the timing of the memory operations. Alternatively, memory 100 may provide a mode that modifies the standard interface timing, in a predictable manner, to accommodate background operations. As an example, the standard interface timing of a DRAM may be modified by adding an extra clock delay to parameters, such as tRD and tRD-WR.

Referring still to FIG. 1, enhanced logic & control 150 may be configured to monitor the status of signals that indicate the beginning and the completion of the DRAM (e.g., when memory 100 is a DRAM) operations. Such signals include, but are not limited to, signals such as row address strobe (RAS), column address strobe (CAS), clock enable (CKE), other DRAM internal signals, or other DRAM signals that are received or sent via the external interfaces of the DRAM. In certain examples, enhanced logic & control 150 may be configured to monitor whether any operation that requires a change to a state of a memory cell in memory 100 has completed. As an example, enhanced logic & control 150 may be configured to detect whether memory 100 is performing a write operation or a read operation. In one example, enhanced logic & control 150 may initiate tasks (e.g., starting a new background function) based on certain new DRAM commands initiated by the host (e.g., a CPU). Such commands may be initiated based on new combinations of the existing DRAM signals (e.g., RAS, CAS, CKE, or WE) and based on new bits for use with the mode registers associated with the DRAM. As an example, enhanced logic & control 150 may access mode registers (e.g., MR0 through MR3) via a standard LOAD MODE command. Enhanced logic & control 150 may be configured to process functions using its compute resources, including registers and storage resources of memory 100. Example functions include but are not limited to: Find First Occurrence, Count Occurrences, Checksum Function, Clear to Constant, Test for Constant, Read Masked, Constant Write Masked, and Error Detection and Correction.

In one example, enhanced logic & control 150 may be configured to operate memory 100 in two different modes. In a first mode, after a host (e.g., a CPU coupled to memory 100) issues an instruction or command to memory 100 to run certain functions in background then memory 100 may opportunistically run the functions in the background without additional instructions from the host. In a second mode, the host may have complete control over when memory 100 is allowed to run any functions in the background. As an example, in the first mode, enhanced logic & control 150 may be configured to keep track of a status of a function running in the background. Enhanced logic & control 150 may be further configured to suspend the function running in the background and resume the function running in the background. Enhanced logic & control 150 may accomplish this by keeping track of the status of signals that indicate the beginning and the completion of the DRAM (e.g., when memory 100 is a DRAM) operations. Such signals include, but are not limited to, signals such as row address strobe (RAS), column address strobe (CAS), clock enable (CKE), other DRAM internal signals, or other DRAM signals that are received or sent via the external interfaces of the DRAM. Thus, as an example, enhanced logic & control 150 may be configured to monitor a status of the RAS and CAS signals. If for a certain pre-configured amount of time, these signals are inactive, then enhanced logic & control 150 may initiate or resume a function that the host had requested memory 100 to perform. Any intermediate results generated during the processing of the function or functions may be stored in internal registers associated with memory 100. Either host could keep track of a status of the function or enhanced logic & control 150 may be configured to keep track of the status of the function.

In the second mode, the host may have complete control over when memory 100 is allowed to run any functions in the background. In one example, complete control may include that only the host may be allowed to initiate or resume background functions being run using memory 100. In one example, the host may be configured to indicate via at least one signal to memory 100 when to initiate or resume a background function. As an example, the host may assert a certain sequence of signals or a type of signal using the clock enable (CKE) signal line for memory 100. In another example, the host may assert a combination of signals including control and address signals to indicate to memory 100 when to initiate or resume a background function. Any intermediate results generated during the processing of the function or functions may be stored in internal registers associated with memory 100. The host could keep track of a status of the function. Although FIG. 1 shows a certain number of components of memory 100 arranged in a certain manner, there could be more or fewer number of components arranged differently. As an example, enhanced logic & control 150 may be integrated with memory 100 in various ways. One way may be to form the logic on the same die as the memory. Alternatively, the logic portion may be integrated by tightly coupling the logic with the memory. Other ways of integrating the logic with the memory are described with respect to FIG. 2.

Figure 2:
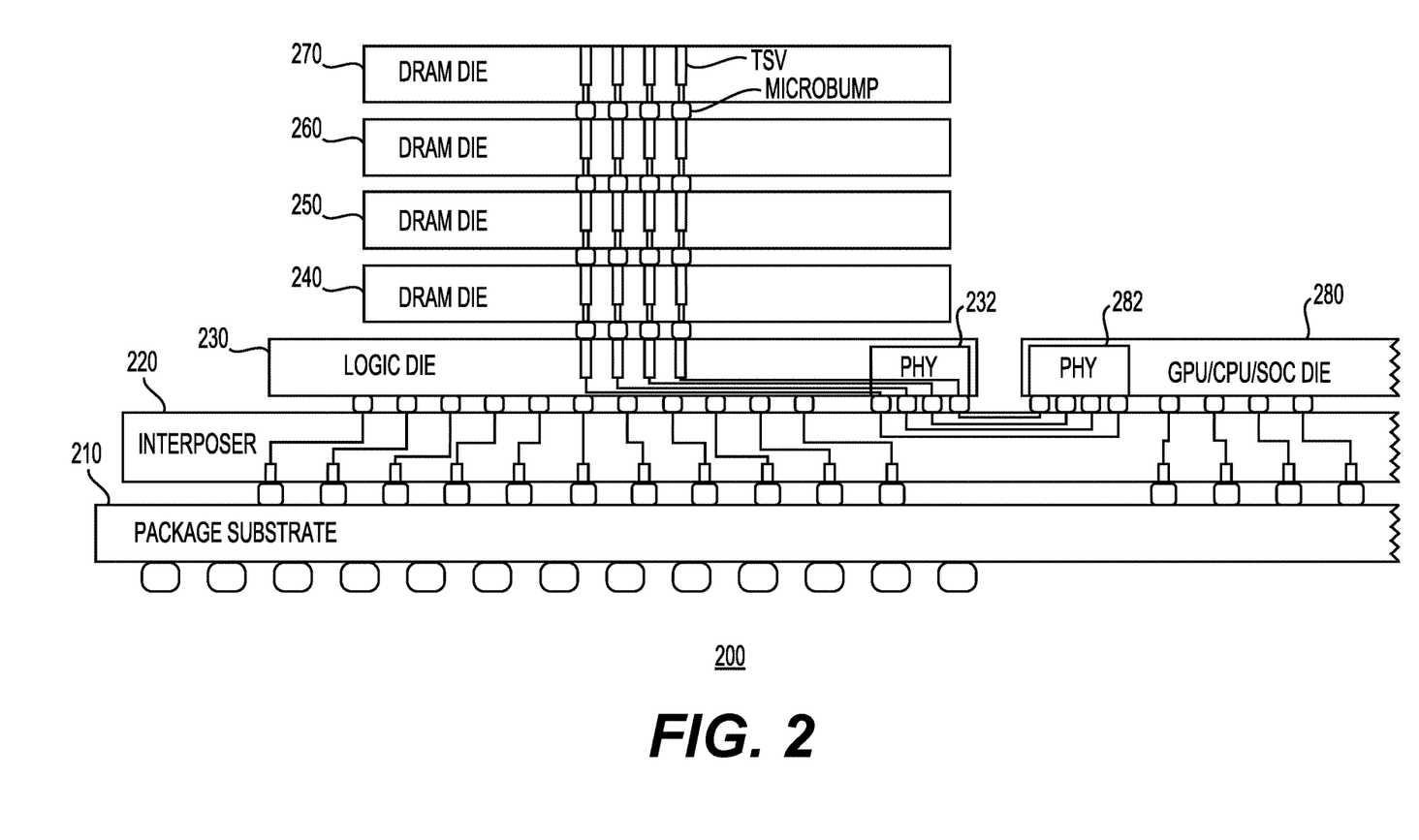
FIG. 2 shows a diagram of a system including memories that may be used to perform functions in the background in accordance with one example.

FIG. 2 shows a diagram of a system 200 including memories that may be used to perform functions in the background. System 200 may include a package substrate 210 connected to an interposer 220. Interposer 220 may further be connected to a DRAM logic die 230 and a host 280. Host 280 may be a graphical processor unit (GPU), a central processing unit (CPU), or a system-on-chip (SOC). Memory dies, such as DRAM die 240, DRAM die 250, DRAM die 260, and DRAM die 270 may be stacked on top of DRAM logic die 230. DRAM logic die 230 may include a component (e.g., PHY 232) and Host 280 may also include a similar component (e.g., PHY 282). These components may be used to physically interconnect the two through interposer 220. DRAM logic die 230 and the stacked DRAM dies may be interconnected via microbumps and through-silicon vias (TSVs). In this system, a host may advantageously offload even more of the functionality to the memory system including DRAM logic die 230 and the stacked DRAM dies. Thus, in one example, each DRAM die may be similarly configured and function as memory 100. In addition, each DRAM die may receive additional commands/instructions from DRAM logic die 230. This way, DRAM logic die 230 may provide the control with respect to when the background functions are initiated or resumed after being suspended. As an example, DRAM logic die 230 may control functions related to security or integrity checks. In another example, each DRAM die may be a standard DRAM die and may not have any enhanced logic & control functionality. Instead, all of the enhanced logic & control functionality as described with respect to memory 100 of FIG. 1 may be included in DRAM logic die 230. Thus, a system may operate in a third mode in which the control of the background functions is shared between DRAM logic die 230 and a host (e.g., host 280). Although FIG. 2 shows a certain number of components of system 200 arranged in a certain manner, there could be more or fewer number of components arranged differently. As an example, the DRAM logic die and the DRAMs need not be stacked. Similarly, although FIG. 2 shows an interposer for interconnecting the DRAM logic die, the host, and the DRAM dies, other interconnection arrangements for integrating the logic with the memory may also be used. As an example, these components may be packages that may be mounted on a PCB or another shared substrate. The host and the DRAM dies may also be packaged side-by-side in a single package substrate.

Figure 3:
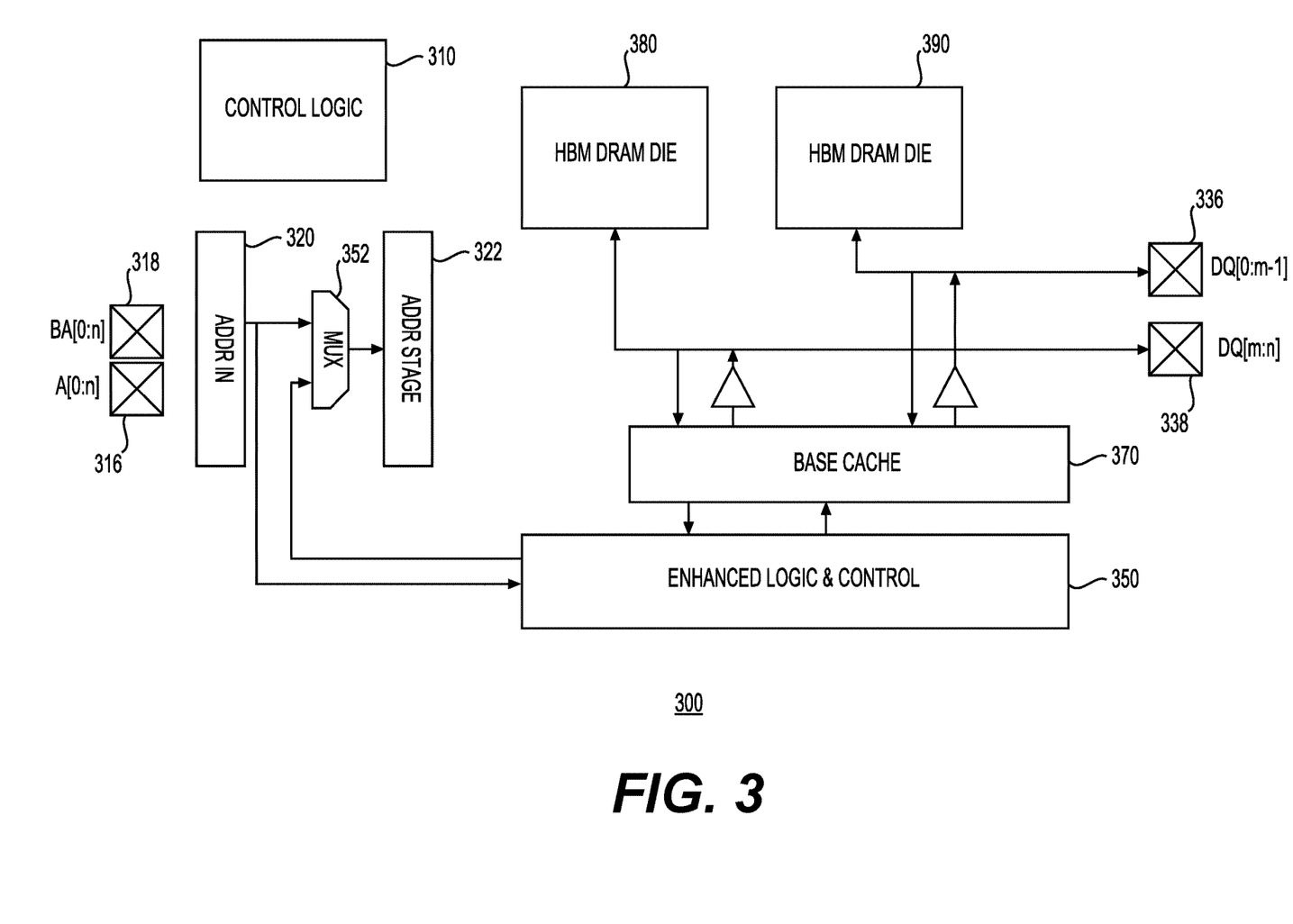
FIG. 3 shows a diagram of a system including memory with enhanced logic and control in accordance with one example.

FIG. 3 shows a diagram of system 300 in accordance with one example. System 300 shows additional details corresponding to system 200. In one example, system 300 may include multiple memory dies (e.g., HBM DRAM die 380 and HBM DRAM die 390). As shown in FIG. 2, in one configuration of the system these DRAM dies may be stacked over a DRAM logic die. In one example, system 300 may include control logic 310, DRAM dies 380 and 390, bank address terminals (BA[0:n]) 318, address terminals (A[0:n]) 316, address latch (e.g., ADDR IN) 320, address stage 322, multiplexer 352, base cache 370, enhanced logic & control 350, input/output pins (DQ[0:m−1] 336 and DQ[m:n] 338). System 300 may receive address information corresponding to data stored in the DRAM dies via bank address terminals (BA[0:n]) 318, address terminals (A[0:n]) 316, and address stage 322. The address information may be used to select a DRAM die and a memory location on the chip. The address terminals may be used for both row and column address selection by asserting the row and column addresses in a multiplexed fashion. The number and organization of address terminals may depend on the memory's size and organization.

With continued reference to FIG. 3, enhanced logic & control 350 may include at least one arithmetic logic unit (ALU) to perform operations, such as add, count, compare, bitwise AND, shift, and bitwise XOR. Enhanced logic & control 350 may further include registers, including general counters, next-address value register, CRC value registers, and other registers for storing intermediate values. Enhanced logic & control 350 may further include data paths and interfaces to read incoming write data and provide calculated data to the core banks or to the input/output pins of the memory. At least one controller incorporated in enhanced logic & control 350 may include logic to perform the following functions: (1) receive legacy and enhanced external commands, (2) pass through incoming addresses into decode logic associated with the memory, (3) transfer incoming data to the respective core bank for legacy commands, (4) receive data from a core bank, (5) generate read and write operations internally, (6) generate new addresses and provide those to the decode logic, and (7) perform complex commands with multiple internal reads and writes in the background without interfering with the timing of the memory operations.

Referring still to FIG. 3, enhanced logic & control 350 may be configured to monitor the status of signals that indicate the beginning and the completion of the DRAM operations associated with any of the DRAM dies included as part of system 300. Such signals include, but are not limited to, signals such as row address strobe (RAS), column address strobe (CAS), clock enable (CKE), other DRAM internal signals, or other DRAM signals that are received or sent via the external interfaces of the DRAM. In certain examples, enhanced logic & control 350 may be configured to monitor whether any operation that requires a change to a state of a memory cell associated with any of the DRAMs has completed. As an example, enhanced logic & control 350 may be configured to detect whether any of the DRAM dies are performing a write operation or a read operation. In one example, enhanced logic & control 350 may initiate tasks (e.g., starting a new background function) based on certain new DRAM commands initiated by the host (e.g., a CPU). Such commands may be initiated based on new combinations of the existing DRAM signals (e.g., RAS, CAS, CKE, or WE) and based on new bits for use with the mode registers associated with the DRAM. As an example, enhanced logic & control 350 may access mode registers (e.g., MR0 through MR3) via a standard LOAD MODE command. Enhanced logic & control 350 may be configured to process functions using compute resources and storage resources located on DRAM logic die 230 of FIG. 2. Example functions include but are not limited to: Find First Occurrence, Count Occurrences, Checksum Function, Clear to Constant, Test for Constant, Read Masked, Constant Write Masked, and Error Detection and Correction. Although FIG. 3 shows a certain number of components of system 300 arranged in a certain manner, there could be more or fewer number of components arranged differently.

In one example, after the host (e.g., a host 280) issues an instruction or command to run certain functions in the background then enhanced logic & control 350 may opportunistically run the functions in the background without additional instructions from the host. Enhanced logic & control 350 may be configured to keep track of a status of a function running in the background. Enhanced logic & control 350 may be further configured to suspend the function running in the background and resume the function running in the background. Enhanced logic & control 350 may accomplish this by keeping track of the status of signals that indicate the beginning and the completion of any of the DRAM operations. Such signals, include but are not limited to signals, such as row address strobe (RAS), column address strobe (CAS), clock enable (CKE), other DRAM internal signals, or other DRAM signals at received or sent via the external interfaces of the DRAM. Thus, as an example, enhanced logic & control 350 may be configured to monitor a status of the RAS and CAS signals. If for a certain pre-configured amount of time these signals are inactive, then enhanced logic & control 350 may initiate or resume a function that the host had requested to be performed. Alternatively, enhanced logic & control 350 may be configured to monitor a status of the word lines or the bit lines associated with the DRAMs to determine when to initiate or resume the function. Any intermediate results generated during the processing of the function or functions may be stored in internal registers associated with enhanced control & logic 350. Either host could keep track of a status of the function or enhanced logic & control 350 may be configured to keep track of the status of the function.

Figure 4:
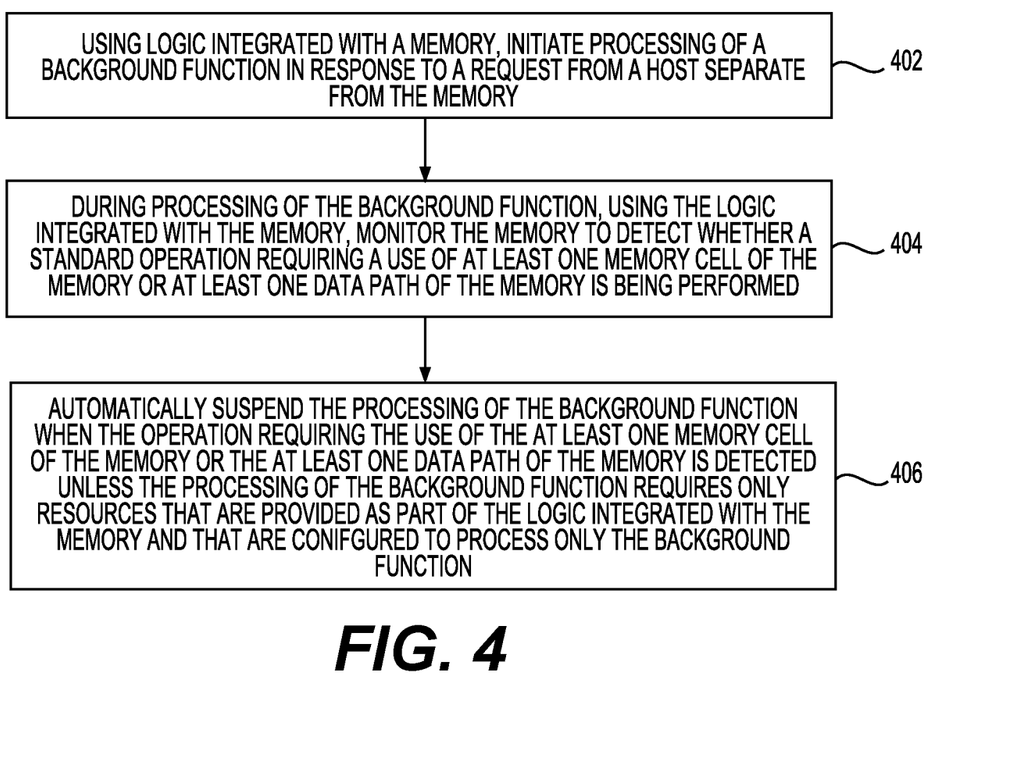
FIG. 4 shows a flow chart of a method for performing background functions in a memory in accordance with one example.

FIG. 4 shows a flow chart of a method in accordance with one example. In one example, the steps described in this method may be performed by the enhanced logic & control located in a memory, such as a DRAM. Step 402 may include using logic integrated with the memory (e.g., a DRAM), initiating the processing of a background function in response to a request from a host separate from the memory. Thus, a CPU may request the DRAM to perform a background function other than a normal read or write operation. As described earlier, the logic integrated with the memory (e.g., logic embedded in the DRAM) may start running the background function at an appropriate time. As discussed with respect to FIG. 5, any of the function code steps may be delayed due to resource conflicts with new foreground commands. As alluded to earlier, one of the functions may be the Find First Occurrence function. This function may include searching through a specified range of addresses for the first address where the bit pattern matches a reference pattern of some desired length. Assume for simplicity here the pattern length is a power of 2 fraction of the row length (e.g., ½ or ¼). An example of the function inputs and the function code is shown in Table 1 below:

TABLE 1

Inputs
StartAddr = starting bit address
EndAddr = ending bit address to search
RowLength = bits per read or write operation to a single row, single bank
ItemLength = number of bits in the bit pattern
MatchItem = bit pattern to search for
CurAddr = StartAddr
NextRowAddr = StartAddr
While (CurAddr <= EndAddr) {
  If (CurAddr >= NextRowAddr) {
    DataBits = Read(NextRowAddr)
    NextRowAddr += RowLength
  }
  Offset = CurAddr − (NextRowAddr − RowLength)
  If (DataBits[ItemLength−1+Offset:Offset] == MatchItem)
    Return(CurAddr)
  CurAddr += ItemLength
}

Another function may be the Count Occurrences function, which may include searching through a specified range of addresses and counting the number of times the bit pattern matches a reference pattern of some length. An example of the function code is shown in Table 2 below:

TABLE 2

```
CurAddr = StartAddr
NextRowAddr = StartAddr
Occurrences = 0
While (CurAddr <= EndAddr) {
    If (CurAddr >= NextRowAddr) {
        DataBits = Read(NextRowAddr)
        NextRowAddr += RowLength
    }
    Offset = CurAddr - (NextRowAddr - RowLength)
    If (DataBits[ItemLength-1+Offset:Offset] == MatchItem)
        Occurrences++
    CurAddr += ItemLength
}
Return(Occurrences)
```

Another function may be the Histogram function, which may include searching through a specified range of addresses and counting the number of itemLength bit patterns that fall into each of a small number of ranges ("bins"). An example of the function inputs and the function code is shown in Table 3 below:

TABLE 3

```
NumBins = number of numeric ranges to count
BinSize = difference between minimum values of adjacent ranges. Assume
here it is a power of 2
BinSizeLog2 = the power of 2
Bins[NumBins] = the set of counters that record the results, read back by
the host at the end
CurAddr = StartAddr
NextRowAddr = StartAddr
Clear Bins to 0
While (CurAddr <= EndAddr) {
    If (CurAddr >= NextRowAddr) {
        DataBits = Read(NextRowAddr)
        NextRowAddr += RowLength
    }
    Offset = CurAddr - (NextRowAddr - RowLength)
    CurBin = DataBits[ItemLength-1+Offset:Offset] >> BinSizeLog2
    Bins[CurBin]++
    CurAddr += ItemLength
}
```

Any of the above functions may be performed on encrypted data as well. To accomplish this the enhanced logic & control in the DRAM may further include: (1) e-fuses to store one or more master keys, programmed during one-time programming during system configuration and (2) registers to store encryption keys. In addition, the host may need to issue a command to the DRAM that allows the host to send wrapped encryption keys; the DRAM may unwrap these using the master key and store them. Furthermore, the background operations may be restricted to address ranges that are properly aligned according to the cryptographic algorithm used (for example, 256 or 512 bytes). Finally, as part of the function code whenever the Read function is called, it may need to be replaced with ReadAndDecrypt (using the appropriate stored encryption key(s)).

Yet another function that may be processed is the Checksum Function. This function may include generating a checksum code (e.g., a cyclic redundancy check (CRC) code) as part of the write operation and checking the code to confirm that none of the bits between a start address and an end address have been modified since they were written. The contents may be encrypted. Thus, the CRC check may work on both encrypted content and decrypted content. The enhanced logic & control described earlier may be augmented to include registers for storing a predetermined number of checksums. The registers may be configured such that only the host can directly perform read or write operations on these registers. To initiate the checksum, the enhanced logic & control may receive a secure command from the host requesting it to generate a checksum for a region between StartAddr and EndAddr. The command may further specify which checksum register(s) to use. As described earlier, the enhanced logic & control inside the DRAM may perform the checksum function in the background. The secure command may only be initiated by the host's root of trust and the enhanced logic & control may be the only hardware that can initiate the checksum function. If during the background processing of the checksum function, a memory location in a region between StartAddr and EndAddr is written (e.g., using a non-standard DRAM write command), then an error may be generated. The background running of the checksum operation may advantageously provide heightened security. As an example, at a programmable interval, the enhanced logic & control may regenerate a checksum for that same region of memory but instead of storing a new value, it may check against the previously stored value. If the check fails, the enhanced logic & control may require the DRAM to optionally block any further reads from that region (e.g., return all zeros or some other programmed constant value).

In addition to the functions described above, other functions may also be performed in the background. Table 4 below provides a non-exhaustive list of such functions:

TABLE 4

| | |
|---|---|
| Clear to constant | Specify the data and the number of bytes to apply it to (could be a large region after the supplied starting address) |
| Test for constant | Test whether an entire burst is zero, or a specified value Check multiple bursts or specified length Read back one Boolean value, indicating the test was successful, or read a count of matching words within the burst |
| Atomics | Increment contents of a specified address Decrement contents of a specified address Perform logic or arithmetic operations with the write data and contents of a specified destination (e.g., dest = dest OP src). |
| Read masked | For any bytes that are masked via a read masked operation, either put the data lines in a high impedance state or preserve previous logic level values. Allows burst cycle on the bus to be skipped, saving power For constant I/O cycle timing, rather than shortening the burst, do not toggle the data lines during the skipped cycles. The mask value could be persistent - stored on the DRAM for subsequent read commands. |
| Error detection and correction | Perform error correction and detection beyond what the memory (e.g., the DRAM) uses for soft error rate mitigation As an example, implement a 9B/8B encoding scheme internally in the memory and take care of any needed address manipulation |
| MIPmap texture generation | Given a predefined tiling configuration, read the average of one or more 2 by 2 pixel blocks |
| Color/depth buffer update | Perform depth test and conditionally update the color |

In step 404, during processing of the function, the logic integrated with the memory (e.g., embedded in the DRAM) may monitor the memory to detect an operation requiring a use at least one memory cell of the memory or at least one data path of the memory. As described earlier with respect to FIG. 1, enhanced logic & control 150 may accomplish this by keeping track of the status of signals that indicate the beginning of the DRAM (e.g., when memory 100 is a DRAM) operations. Such signals include, but are not limited to, signals such as row address strobe (RAS), column address strobe (CAS), clock enable (CKE), other DRAM internal signals, or other DRAM signals that are received or sent via the external interfaces of the DRAM. Thus, as an example, enhanced logic & control 150 may be configured to monitor a status of the RAS and CAS signals. If for a certain pre-configured amount of time, these signals are inactive, then enhanced logic & control 150 may initiate a function that the host had requested memory 100 to perform. Alternatively, enhanced logic & control 150 may be configured to monitor a status of the word lines or the bit lines associated with memory 100 to determine when to initiate the function.

Step 406 may include automatically suspending the processing of the function when the operation requiring the use of the at least one memory cell of the memory is detected unless the processing of the background function requires only resources that are provided as part of the logic integrated with the memory and that are configured to process only the background function. The method may further include automatically resuming processing of the function after the completion of the operation requiring the use of the at least one memory cell of the memory or the at least one data path of the memory. As described earlier with respect to FIG. 1, enhanced logic & control 150 may accomplish this by keeping track of the status of signals that indicate the beginning of the DRAM (e.g., when memory 100 is a DRAM) operations. Such signals include, but are not limited to, signals such as row address strobe (RAS), column address strobe (CAS), clock enable (CKE), other DRAM internal signals, or other DRAM signals that are received or sent via the external interfaces of the DRAM. Thus, as an example, enhanced logic & control 150 may be configured to monitor a status of the RAS and CAS signals. If for a certain pre-configured amount of time, these signals are inactive, then enhanced logic & control 150 may initiate or resume a function that the host had requested memory 100 to perform. Alternatively, enhanced logic & control 150 may be configured to monitor a status of the word lines or the bit lines associated with memory 100 to determine when to resume the function.

Figure 5:
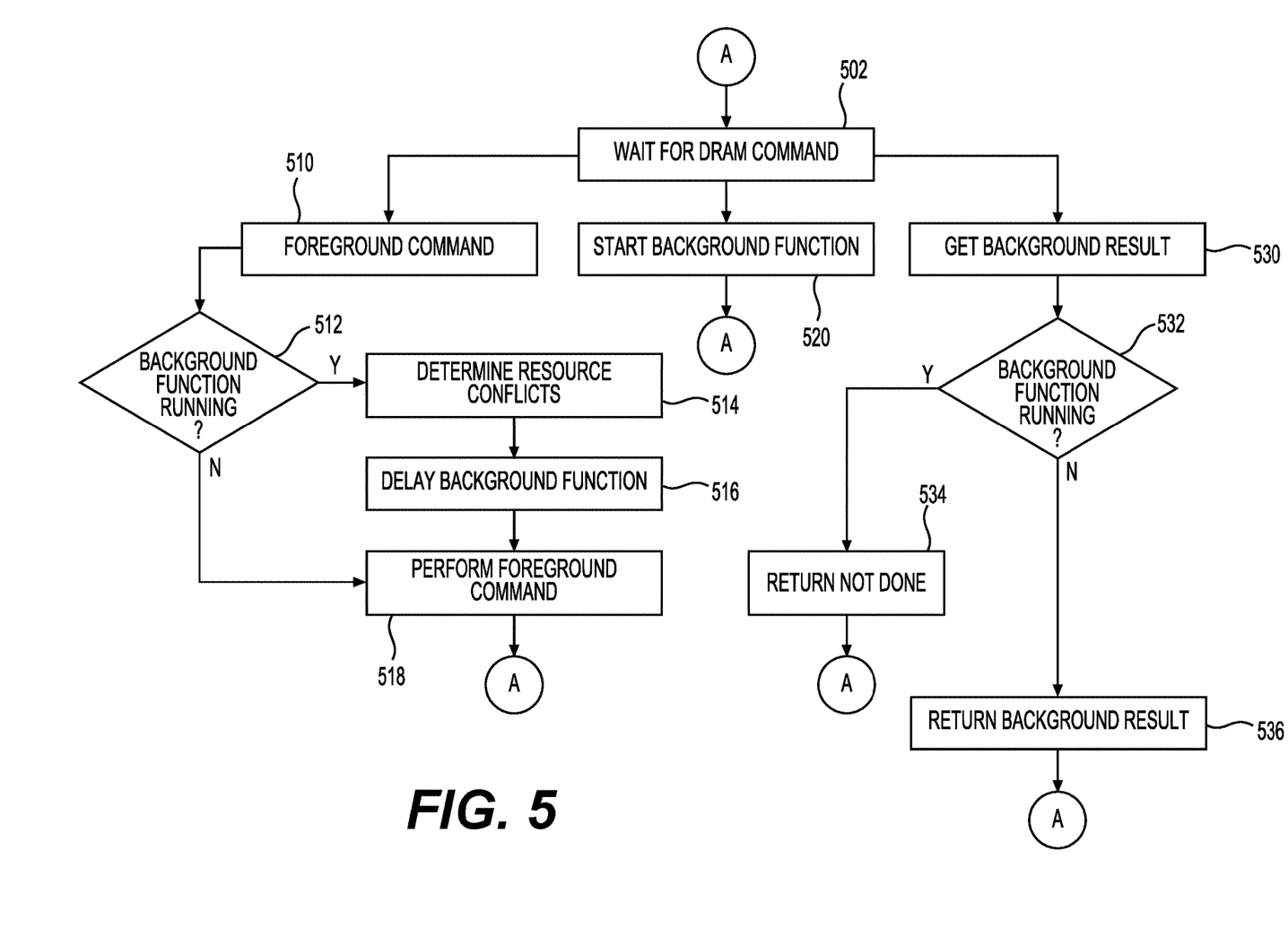
FIG. 5 shows another flow chart showing steps related to a memory in accordance with one example.

FIG. 5 shows another flow chart showing steps related to memory 100 in accordance with one example. In step 502, a memory, for example a DRAM may wait for a command. If, as in step 510, a foreground command (e.g., a read or write command from a host) is received by the DRAM, then in step 512, the DRAM (e.g., the enhanced logic and control) may determine whether a background function is running. If a background function is running, then in step 514, enhanced logic and control may determine whether this creates resource conflicts. Resource conflicts may relate to determining whether any of the DRAM resources that will be used by the foreground command are being used by the background function in a manner that will adversely affect the performance of the foreground command. In step 516, enhanced control and logic may delay the background function. The DRAM may perform the foreground command, in step 518, after the delay or if in step 512 no running background function was detected.

Referring still to FIG. 5, while the DRAM is waiting to receive a command, it can start the background function (e.g., in step 520). The DRAM may further include the ability to process a new foreground command: Get Background Result (step 530). After receiving this command, enhanced logic and control may determine whether a background function is running (step 532). If no background function is running, then in step 536, enhanced logic and control may return background results. Alternatively, enhanced logic and control may return a message or status, such as Not Done. Although FIG. 5 describes the steps in a certain order, they need not be performed in this order.

In conclusion, the present disclosure relates to a method in a memory, having a plurality of memory cells, configured to perform standard operations based on at least one specification promulgated by a standards body. The method may include, using logic integrated with the memory, in response to a request from a host separate from the memory, initiating processing of a background function. The method may further include during processing of the background function using the logic integrated with the memory, automatically monitoring the memory to detect whether any standard operation requiring a use of at least one of the plurality of the memory cells of the memory or at least one data path of the memory is being performed. The method may further include automatically suspending the processing of the background function when the standard operation requiring the use of the at least one of the plurality of the memory cells of the memory or the at least one data path of the memory is detected unless the processing of the background function requires only resources that are provided as part of the logic integrated with the memory and that are configured to process only the background function.

The method may further include automatically resuming processing of the background function: (1) after completion of the standard operation requiring the use of the at least one of the plurality of memory cells of the memory or the at least one data path of the memory or (2) upon resolution of a resource conflict between the standard operation and the background function. The method may further include in response to a resume request from the host, resuming processing of the background function: (1) after completion of the standard operation requiring the use of the at least one of the plurality of memory cells of the memory or the at least one data path of the memory or (2) upon resolution of a resource conflict between the standard operation and the background function.

The monitoring the memory to detect whether any standard operation requiring the use of the at least one of the plurality of memory cells of the memory or the at least one data path of the memory may comprise monitoring a status of at least one signal corresponding to at least a subset of the standard operations.

The method may further include automatically performing the background function without interruption after the background function is resumed. The background function may be selected from a group consisting of a find first occurrence function, a count occurrences function, a checksum function, a clear to constant function, a test for constant function, a read masked function, a constant write masked function, and an error detection and correction function.

The method may further include the memory receiving a non-standard foreground command from the host and the memory, in response to the non-standard foreground command, providing any results generated by the processing of the background function to the host upon completion of the processing of the background function.

In another example, the present disclosure relates to a memory having a plurality of memory cells and logic integrated with the memory, where the memory is configured to perform standard operations based on at least one specification promulgated by a standards body. The logic integrated with the memory may be configured to, in response to a request from a host, separate from the memory, initiate processing of a background function. The logic integrated with the memory may further be configured to during processing of the background function, automatically monitor the memory to detect whether any standard operation requiring a use of at least one of the plurality of the memory cells of the memory or at least one data path of the memory is being performed. The logic integrated with the memory may further be configured to automatically suspend the processing of the background function when the standard operation requiring the use of the at least one of the plurality of the memory cells of the memory or the at least one data path of the memory is detected unless the processing of the background function requires only resources that are provided as part of the logic integrated with the memory and that are configured to process only the background function.

The logic integrated with the memory may further be configured to automatically resume processing of the background function: (1) after completion of the standard operation requiring the use of the at least one of the plurality of memory cells of the memory or the at least one data path of the memory or (2) upon resolution of a resource conflict between the standard operation and the background function. The logic integrated with the memory may further be configured to, in response to a resume request from the host, resume processing of the background function: (1) after completion of the standard operation requiring the use of the at least one of the plurality of memory cells of the memory or the at least one data path of the memory or (2) upon resolution of a resource conflict between the standard operation and the background function.

The logic integrated with the memory may further be configured to monitor a status of at least one signal corresponding to at least a subset of the standard operations. The logic integrated with the memory may further be configured to automatically perform the background function without interruption after the background function is resumed. The background function may be selected from a group consisting of a find first occurrence function, a count occurrences function, a checksum function, a clear to constant function, a test for constant function, a read masked function, a constant write masked function, and an error detection and correction function. The logic integrated with the memory may further be configured to receive a non-standard foreground command from the host and to provide, in response to the non-standard foreground command, any results generated by the processing of the background function to the host upon completion of the processing of the background function.

In another example, the present disclosure relates to a memory having a plurality of memory cells and logic integrated with the memory, where the memory is configured to perform standard operations based on at least one specification promulgated by a standards body. The memory may further be configured to operate in a first mode and operate in a second mode. In the first mode, the memory may be configured to: in response to a first request from a host separate from the memory, initiate processing of a first background function, during processing of the first background function using the logic integrated with the memory, automatically monitor the memory to detect whether any standard operation requiring a use of at least one of the plurality of the memory cells of the memory or at least one data path of the memory is being performed, and automatically suspend the processing of the first background function when the standard operation requiring the use of the at least one of the plurality of the memory cells of the memory or the at least one data path of the memory is detected unless the processing of the first background function requires only resources that are provided as part of the logic integrated with the memory and that are configured to process only the first background function. In the second mode, the memory may be configured to: in response to a second request from the host separate from the memory, initiate processing of a second background function, initiate processing of a background function, in response to a third request from the host, suspend the processing of the second background function, and in response to a fourth request from the host, resume the processing of the second background function.

The memory may further be configured to automatically resume processing of the first background function: (1) after completion of the standard operation requiring the use of the at least one of the plurality of memory cells of the memory or the at least one data path of the memory or (2) upon resolution of a resource conflict between the standard operation and the first background function. In the first mode, the memory may further be configured to monitor a status of at least one signal corresponding to at least a subset of the standard operations. In the first mode, the memory may further be configured to monitor a status of word lines or bit lines of the memory.

The background function may be selected from a group consisting of a find first occurrence function, a count occurrences function, a checksum function, a clear to constant function, a test for constant function, a read masked function, a constant write masked function, and an error detection and correction function. In addition, both in the first mode and the second mode, the memory may further be configured to receive a non-standard foreground command from the host and to provide, in response to the non-standard foreground command, any results generated by the processing of the first background function or the second background function to the host upon completion of the processing of a respective background function.

It is to be understood that the methods, modules, and components depicted herein are merely exemplary. Alternatively, or in addition, the functionality described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with some examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory such as DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A method in a memory, having a plurality of memory cells, configured to perform standard operations based on at least one specification promulgated by a standards body, the method comprising:

using logic integrated within the memory, in response to a request from a host separate from the memory, initiating processing of a background function;

during processing of the background function using the logic integrated within the memory, automatically monitoring the memory to detect whether any standard operation requiring a use of at least one of the plurality of the memory cells of the memory or at least one data path of the memory is being performed; and automatically suspending the processing of the background function when the standard operation requiring the use of the at least one of the plurality of the memory cells of the memory or the at least one data path of the memory is detected unless the processing of the background function requires only resources that are provided as part of the logic integrated within the memory and only the resources that are allocated to process only the background function.

2. The method of claim 1 further comprising automatically resuming processing of the background function: (1) after completion of the standard operation requiring the use of the at least one of the plurality of memory cells of the memory or the at least one data path of the memory or (2) upon resolution of a resource conflict between the standard operation and the background function.

3. The method of claim 1 further comprising in response to a resume request from the host, resuming processing of the background function: (1) after completion of the standard operation requiring the use of the at least one of the plurality of memory cells of the memory or the at least one data path of the memory or (2) upon resolution of a resource conflict between the standard operation and the background function.

4. The method of claim 1, wherein the monitoring the memory to detect whether any standard operation requiring the use of the at least one of the plurality of the memory cells of the memory or the at least one data path of the memory comprises monitoring a status of at least one signal corresponding to at least a subset of the standard operations.

5. The method of claim 2 further comprising automatically performing the background function without interruption after the background function is resumed.

6. The method of claim 1, wherein the background function is selected from a group consisting of a find first occurrence function, a count occurrences function, a checksum function, a clear to constant function, a test for constant function, a read masked function, a constant write masked function, and an error detection and correction function.

7. The method of claim 1 further comprising the memory receiving a non-standard foreground command from the host and the memory, in response to the receiving the non-standard foreground command, providing any results generated by the processing of the background function to the host upon completion of the processing of the background function.

8. A memory having a plurality of memory cells and logic integrated within the memory, wherein the memory is configured to perform standard operations based on at least one specification promulgated by a standards body, the logic integrated within the memory configured to:

in response to a request from a host separate from the memory, initiate processing of a background function;

during processing of the background function, automatically monitor the memory to detect whether any standard operation requiring a use of at least one of the plurality of the memory cells of the memory or at least one data path of the memory is being performed; and automatically suspend the processing of the background function when the standard operation requiring the use of the at least one of the plurality of the memory cells of the memory or the at least one data path of the memory is detected unless the processing of the background function requires only resources that are provided as part of the logic integrated within the memory and only the resources that are allocated to process only the background function.

9. The memory of claim 8, wherein the logic integrated within the memory is further configured to automatically resume processing of the background function: (1) after completion of the standard operation requiring the use of the at least one of the plurality of memory cells of the memory or the at least one data path of the memory or (2) upon resolution of a resource conflict between the standard operation and the background function.

10. The memory of claim 8, wherein the logic integrated within the memory is further configured to, in response to a resume request from the host, resume processing of the background function: (1) after completion of the standard operation requiring the use of the at least one of the plurality of memory cells of the memory or the at least one data path of the memory or (2) upon resolution of a resource conflict between the standard operation and the background function.

11. The memory of claim 8, wherein the logic integrated within the memory is further configured to monitor a status of at least one signal corresponding to at least a subset of the standard operations.

12. The memory of claim 9, wherein the logic integrated within the memory is further configured to automatically perform the background function without interruption after the background function is resumed.

13. The memory of claim 8, wherein the background function is selected from a group consisting of a find first occurrence function, a count occurrences function, a checksum function, a clear to constant function, a test for constant function, a read masked function, a constant write masked function, and an error detection and correction function.

14. The memory of claim 8, wherein the memory is further configured to receive a non-standard foreground command from the host and to provide, in response to receiving the non-standard foreground command, any results generated by the processing of the background function to the host upon completion of the processing of the background function.

15. A memory having a plurality of memory cells and logic integrated within the memory, wherein the memory is configured to perform standard operations based on at least one specification promulgated by a standards body, wherein the memory is configured to:
  operate in a first mode and operate in a second mode,
    wherein in the first mode the memory is configured to:
      in response to a first request from a host separate from the memory, initiate processing of a first background function,
      during processing of the first background function using the logic integrated within the memory, automatically monitor the memory to detect whether any standard operation requiring a use of at least one of the plurality of the memory cells of the memory or at least one data path of the memory is being performed, and
      automatically suspend the processing of the first background function when the standard operation requiring the use of the at least one of the plurality of the memory cells of the memory or the at least one data path of the memory is detected unless the processing of the first background function requires only resources that are provided as part of the logic integrated within the memory and only the resources that are allocated to process only the first background function; and
    in the second mode, the memory is configured to:
      in response to a second request from the host separate from the memory, initiate processing of a second background function,
      in response to a third request from the host, suspend the processing of the second background function, and
      in response to a fourth request from the host, resume the processing of the second background function.

16. The memory of claim 15, wherein in the first mode the memory is further configured to automatically resume processing of the first background function: (1) after completion of the standard operation requiring the use of the at least one of the plurality of memory cells of the memory or the at least one data path of the memory or (2) upon resolution of a resource conflict between the standard operation and the first background function.

17. The memory of claim 15, wherein in the first mode the memory is further configured to monitor a status of at least one signal corresponding to at least a subset of the standard operations.

18. The memory of claim 15, wherein in the first mode the memory is further configured to monitor a status of word lines or bit lines of the memory.

19. The memory of claim 15, wherein the first background function or the second background function is selected from a group consisting of a find first occurrence function, a count occurrences function, a checksum function, a clear to constant function, a test for constant function, a read masked function, a constant write masked function, and an error detection and correction function.

20. The memory of claim 15, wherein in both the first mode and the second mode the memory is further configured to receive a non-standard foreground command from the host and to provide, in response to the non-standard foreground command, any results generated by the processing of the first background function or the second background function to the host upon completion of the processing of a respective background function.

* * * * *